United States Patent [19]
Polzin et al.

[11] Patent Number: 6,166,545
[45] Date of Patent: Dec. 26, 2000

[54] MRI RECONSTRUCTION USING PARTIAL ECHO AND PARTIAL NEX DATA ACQUISITIONS

[75] Inventors: Jason A. Polzin, Lake Mills, Wis.; Matthew A. Bernstein, Rochester, Minn.; Thomas K. F. Foo, Rockville, Md.

[73] Assignee: General Electric Company, Milwaukee, Wis.

[21] Appl. No.: 09/219,129

[22] Filed: Dec. 22, 1998

Related U.S. Application Data

[60] Provisional application No. 60/086,769, May 26, 1998.
[51] Int. Cl.[7] .................................................. G01V 3/00
[52] U.S. Cl. ........................ 324/309; 324/309; 324/307
[58] Field of Search .................................. 324/309, 307, 324/300, 312, 318; 600/420, 410

[56] References Cited

PUBLICATIONS

Noll, Douglas C., et al., *Homodyne Detection in Magnetic Resonance Imaging*, IEEE Transactions on Medical Imaging, vol. 10, No. 2, Jun. 1991, pp. 154–163.

Margosian, P., et al., *Faster MR Imaging with Half the Data*, Health Care Instrumentation, vol. 1: pp. 195–197.

*Primary Examiner*—Christine K. Oda
*Assistant Examiner*—Dixomara Vargas
*Attorney, Agent, or Firm*—Boyle, Fredrickson; Christian G. Cabou; Phyllis Y. Price

[57] ABSTRACT

A system and method is disclosed to combine both a fractional echo ($k_x$) and a fractional NEX ($k_y$) to reduce acquisition times and echo times in MR imaging. The method uses both zero-filling and homodyne reconstruction to construct concurrent fractional NEX and fractional echo data in a single image while minimizing any blurring effects. The system includes acquiring partial MRI data in the $k_x$ direction and acquiring partial MRI data in the $k_y$ direction. Once a partial echo and a partial NEX are acquired, the missing data is first zero-filled in the $k_x$ direction and Fourier transformed to acquire a full x direction data set. Next, the data is synthesized in the $k_y$ direction using a homodyne reconstruction technique to acquire a full data set in the $k_y$ direction. The full x,y data set can then be used to reconstruct an MR image with reduced acquisition and echo times. In order to minimize the effects of blurring in the resulting MR image, it is preferable to acquire at least an 80% fractional echo and a 60% fractional NEX. The system can be extended to any number of desirable dimensions.

22 Claims, 3 Drawing Sheets

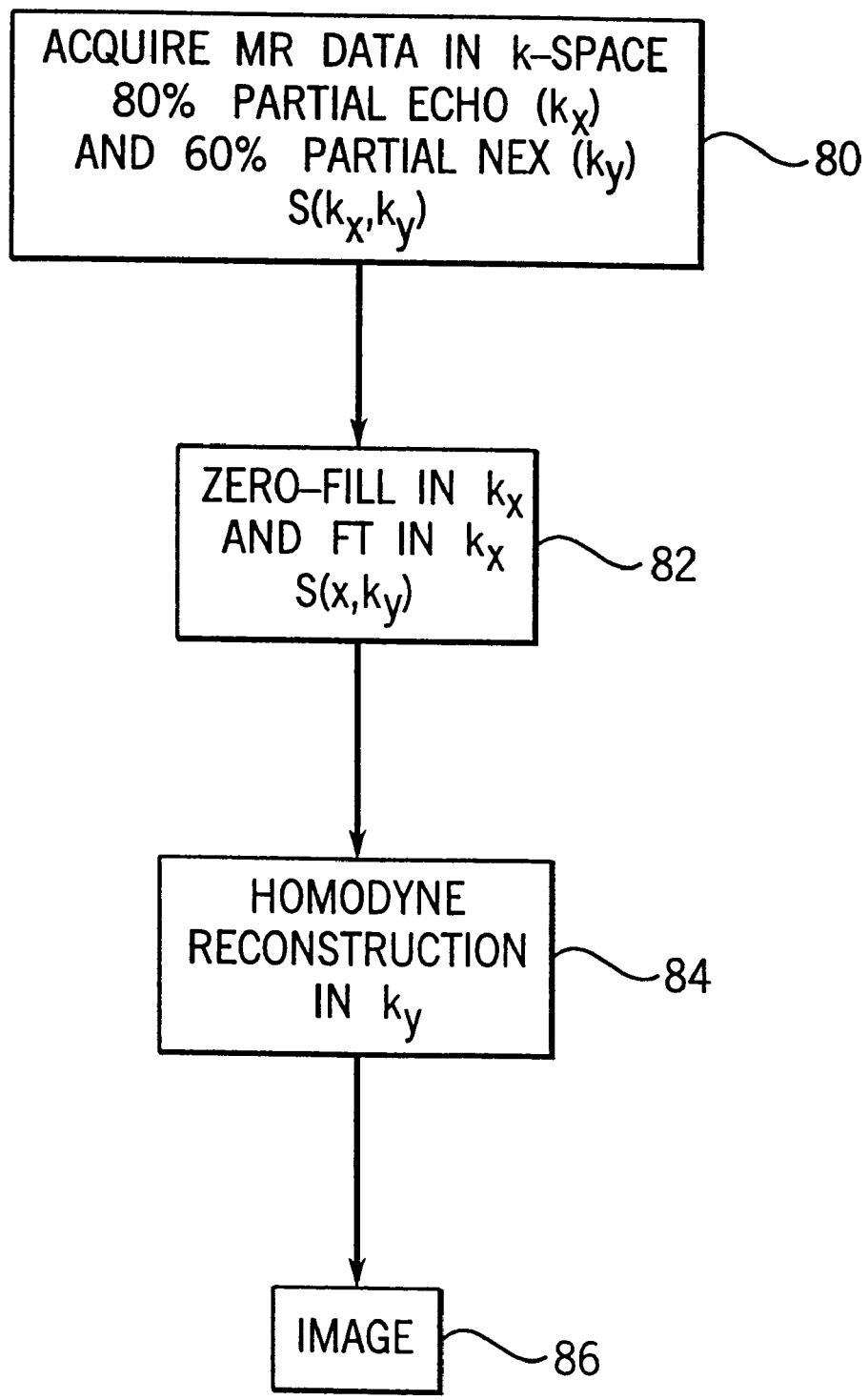

MRI RECONSTRUCTION USING PARTIAL ECHO AND PARTIAL NEX DATA ACQUISITIONS

This application claims the benefit of the Provisional Patent Application Ser. No. 60/086,769, filed May 26, 1998.

BACKGROUND OF THE INVENTION

The present invention relates generally to magnetic resonance imaging (MRI), and more particularly to an MR imaging system and a method to reconstruct an MR image using both a partial, or fractional, $k_x$ data acquisition and a partial, or fractional $k_y$ data acquisition to reduce total acquisition scan time.

In MR imaging, to date, the scan time can be reduced by using a partial $k_x$ data set, also known as a partial echo, or a partial $k_y$ data set, also known as a partial NEX (number of excitations in ky), but not both. By acquiring a fractional echo, the echo times in MR imaging are reduced by shifting the echo formation to a time earlier in the readout window. The missing data can be reconstructed by either zero-filling along the $k_x$ direction prior to Fourier transformation, or by using a homodyne or partial k-space reconstruction technique. Under both reconstruction techniques, at least 50% of the data must be acquired. Similarly, obtaining a fractional NEX reduces the total acquisition time by acquiring either slightly more than half of the views of a full NEX to approximately three-quarters of the views of a full NEX. As in fractional echo, the missing data is either zero-filled or estimated with a homodyne or partial k-space reconstruction technique. Current methods do not allow the reconstruction of both a partial echo and a partial NEX data acquisition in the same MR image.

Therefore, it would be desirable to have a system and method capable of combining both a partial echo and a partial NEX to reduce both acquisition times and echo times in MR imaging without significant blurring effects in the resulting image.

SUMMARY OF THE INVENTION

The present invention provides a system and method of concurrent fractional echo and fractional NEX data acquisitions and reconstruction in the same MR image that overcomes the aforementioned problems and results in an acceptable MR image with reduced acquisition and echo times.

The present invention includes a method of MR imaging using fractional MRI acquisitions to reduce total acquisition time that includes initiating an MRI scan to acquire MRI data in k-space and in doing so, acquiring a partial data set along the $k_x$ direction. The partial MRI $k_x$ data set would necessarily include less than 100% of $k_x$ direction data and more than 50% of the $k_x$ direction data. Preferably, the $k_x$ direction data set would comprise approximately 80% of the possible $k_x$ direction data. The method next includes acquiring a partial MRI $k_y$ data set along a $k_y$ direction in k-space. The MRI $k_y$ data set would also include less than 100% of the possible $k_y$ direction data and more than 50% of the $k_y$ direction data. Preferably, the acquired partial MRI $k_y$ data set would include 60% of the possible data in the $k_y$ direction. In order to reconstruct the NMR image using the partial MRI $k_x$ data set and the partial MRI $k_y$ data set, the method includes first zero-filling missing data in the $k_x$ direction by using the acquired partial MRI $k_x$ data set and Fourier transforming the $k_x$ data to generate a decoded image in the x-direction, and then secondly, the method includes synthesizing missing data in the $k_y$ direction by applying a homodyne or partial k-space reconstruction algorithm to the reconstructed, or $I(x,k_y)$ data set.

Accordingly, another aspect of the invention includes an MR data acquisition system designed to reduce total acquisition time. The system includes a magnetic resonance imaging system, as is known in the art, to acquire MR images. The system includes a computer programmed to acquire a partial MR data set having partial data present in the $k_x$ and the $k_y$ directions and having data missing in both the $k_x$ direction and the $k_y$ direction. The computer is further programmed to Fourier transform the partial MR data set in the $k_x$ direction to generate an equivalent full x data set and synthesize the partial MR data set in the $k_y$ direction using the equivalent full x data set in a homodyne reconstruction technique to acquire an equivalent full x,y data set. The computer is also programmed to reconstruct an MR image using the equivalent full x,y data set. The MR data acquisition system produces an image with minimal blurring effects and significant reduced echo and acquisition times.

In accordance with another aspect of the invention, an MRI system for minimizing data acquisition time is disclosed having a means for partially acquiring an MRI data set in both a $k_x$ direction and a $k_y$ direction. The MRI system also includes a means for interpolating the partial MRI data set into a $S(x, k_x)$ MRI data set and a means for synthesizing the $S(x, k_y)$ MRI data set in the $k_y$ direction to form a complete x,y MRI data set in both the x and y directions. The MRI system includes a means for constructing an MRI using the complete x,y MRI data set acquired with reduced TE time.

Various other features, objects and advantages of the present invention will be made apparent from the following detailed description and the drawings.

BRIEF DESCRIPTION OF THE DRAWINGS

The drawings illustrate the best mode presently contemplated for carrying out the invention.

In the drawings:

FIG. 6 is a flow chart depicting the system and method of the present invention.

DETAILED DESCRIPTION OF THE PREFERRED EMBODIMENT

Figure 1:
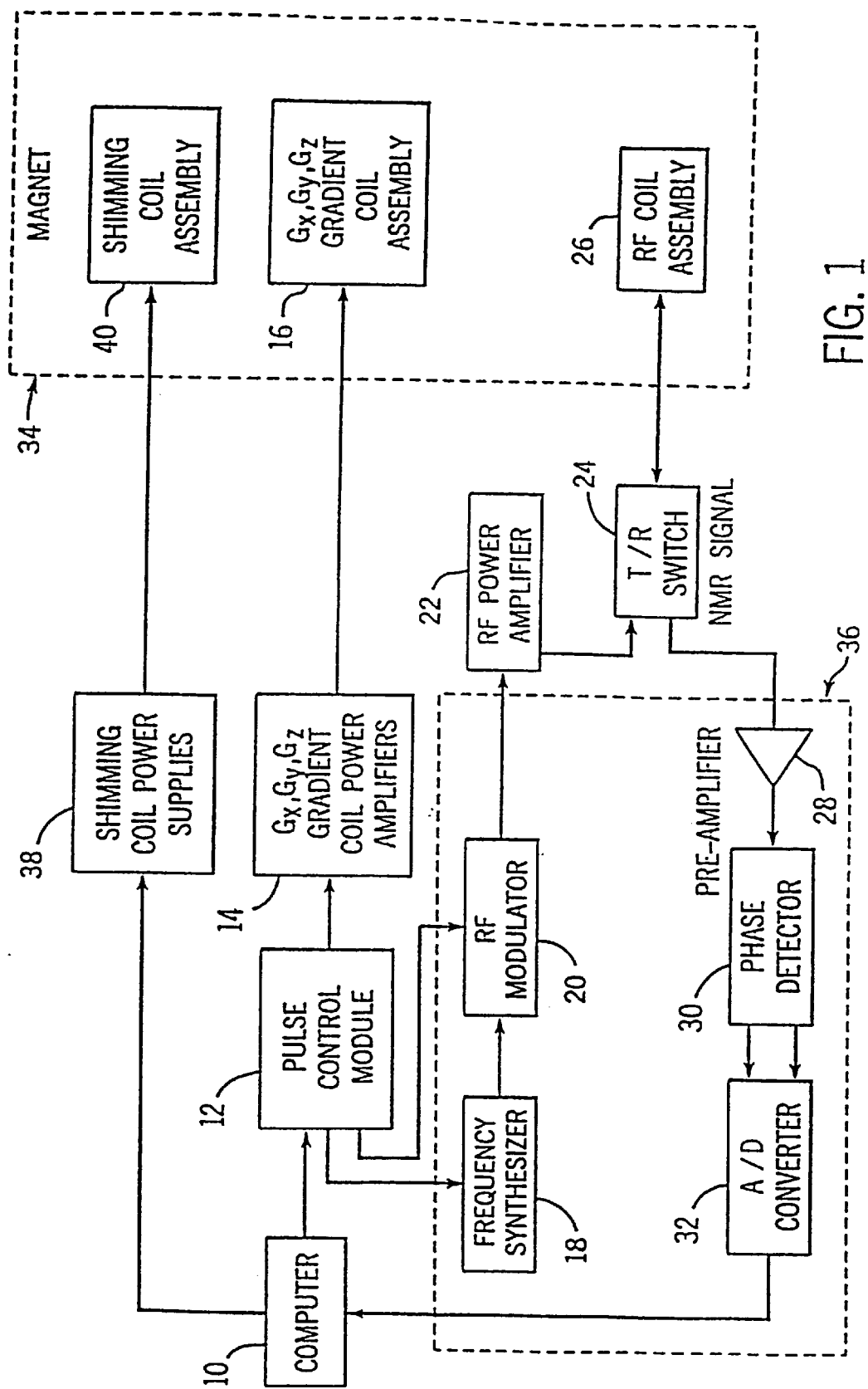
FIG. 1 is a schematic block diagram of an MR imaging system for use with the present invention.

Referring to FIG. 1, a nuclear magnetic resonance (NMR) imaging system of a type suitable for the practice of the invention includes a computer 10 which controls gradient coil power amplifiers 14 through a pulse control module 12. The pulse control module 12 and the gradient amplifiers 14 together produce the proper gradient waveforms Gx, Gy, and Gz, for either a spin echo, a gradient recalled echo pulse sequence, a fast spin echo, or other type of pulse sequences. The gradient waveforms are connected to gradient coils 16 which are positioned around the bore of the magnet 34 so that gradients Gx, Gy, and Gz are impressed along their respective axes on the polarizing magnetic field Bo from magnet 34.

The pulse control module 12 also controls a radio frequency synthesizer 18 which is part of an RF transceiver system, portions of which are enclosed by dashed line block 36. The pulse control module 12 also controls an RF modulator 20 which modulates the output of the radio frequency synthesizer 18. The resultant RF signals, amplified by power amplifier 22 and applied to RF coil 26 through transmit/receive switch 24, are used to excite the nuclear spins of the imaged object (not shown).

The NMR signals from the excited nuclei of the imaged object are picked up by the RF coil 26 and presented to preamplifier 28 through transmit/receive switch 24, to be amplified and then processed by a quadrature phase detector 30. The detected signals are digitized by a high speed A/D converter 32 and applied to computer 10 for processing to produce NMR images of the object. Computer 10 also controls shimming coil power supplies 38 to power shimming coil assembly 40.

The present invention includes a method and system suitable for use with the above-referenced NMR system, or any similar or equivalent system for obtaining MR k-space data for use in reconstructing MR images.

The present invention includes initiating an MRI scan to acquire MRI data and acquiring a partial or fractional echo and a partial or fractional NEX. The partial echo is a partial MRI $k_x$ data set acquired in k-space along a $k_x$ direction. The partial MRI $k_x$ data set must contain at least 50% of the $k_x$ data. The partial NEX includes acquiring a partial MRI $k_y$ data set in k-space along a $k_y$ direction. The partial MRI $k_y$ data set also must contain at least 50% of the data in the $k_y$ direction. Once the partial echo and a partial NEX are acquired, an MRI image can be reconstructed by first zero-filling the missing data in the $k_x$ direction by using the acquired partial MRI $k_x$ data set, Fourier transforming the partial $k_x$ data set into a full x data set, and then the missing data in the $k_y$ direction can be synthesized by using the acquired data in the $k_x$ direction along with the zero-filled data, as will be described in further detail hereinafter.

Figure 2:
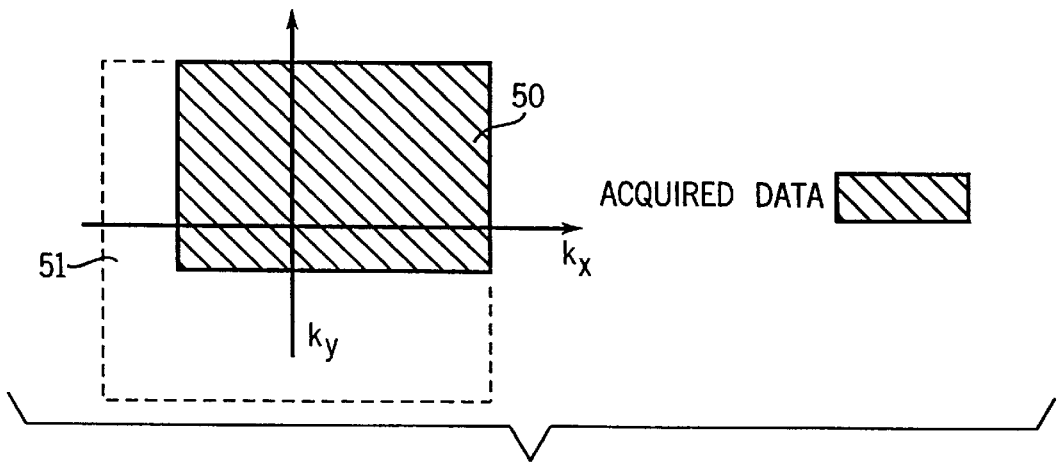
FIG. 2 is a graphical representation of a partially acquired data set in k-space.

Referring to FIG. 2, a graphical representation of a partial MRI data set 50. For illustrative purposes, the larger area 51 shows what would be a complete MRI data set if full echo and full NEX scans were acquired along the $k_x$ direction and the $k_y$ direction. Therefore, the acquired partial MRI data set 50 has data lying between $-k_{x0} < k_x < k_{xmax}$ and $-k_{y0} < k_y < k_{ymax}$. From this generalized description, an MR image can be reconstructed according to the following steps.

Figure 3:
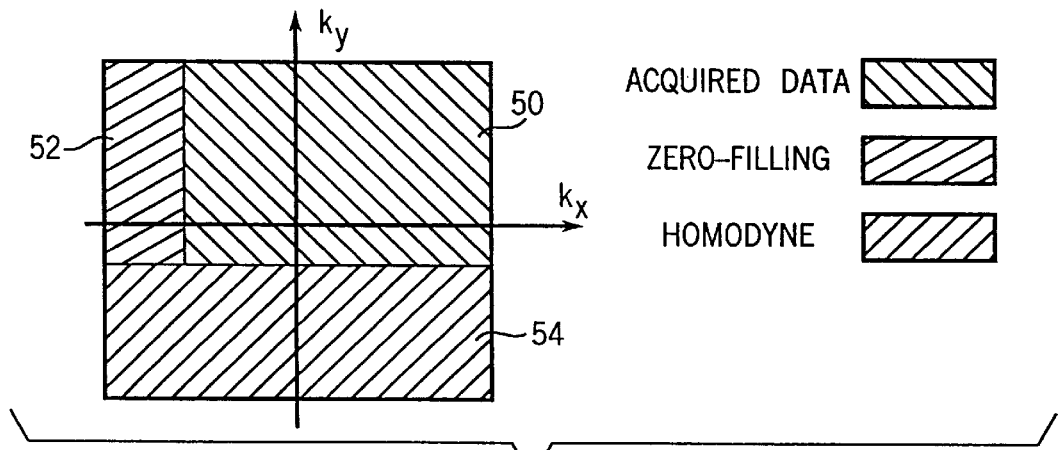
FIG. 3 is a graphical representation of the partially acquired data of FIG. 2, along with reconstructed data in k-space.

Referring to FIG. 3, once the partial MRI data 50 is acquired in the $k_x$ and $k_y$ directions, via a partial or fractional echo and a partial or fractional NEX, the missing data in the $-k_x$ direction can be reconstructed or synthesized. To reconstruct the missing $-k_x$ data, a procedure known as zero-filling is used along the frequency encoding direction $k_x$. For example, the missing k-space data values that are in the set $-k_{x\,max} < k_x < -k_{x0}$ are assigned zero values. The resulting data is nearly equivalent to the full $k_x$ data set, which is referred to as $S(k_x, k_y)$ in k-space, multiplied by the step function $u(k_x+k_{x0})$, resulting in:

$$S'(k_x,k_y)=S'(k_x,k_y)u(k_x+k_{x0}). \qquad [1]$$

Next, a Fermi window is applied to the $S(k_x, k_y)$ data along the frequency encoding direction, $k_x$, to smooth the data transition region about $-k_{x0}$, in order to reduce truncation artifacts, which can result in ringing in the resulting image. The Fermi-windowed data is Fourier transformed along the frequency encoding direction, $k_x$. That is, the zero-filled data, $S'(k_x, k_y)$, is Fourier transformed along $k_x$ resulting in $S'(x, k_y)$ which is equivalent to:

$$S'(x,k_y)=S'(x,k_y) \otimes FT^{-1}(u(k_x+k_{x0})). \qquad [2]$$

Because the convolution term in equation number (2) results in blurring along the x direction, there is a trade-off between obtaining high quality images and reducing the total acquisition time for the MR image. That is, to obtain a relatively high quality image and reduce the blurring along the x direction, it is necessary to have a high echo fraction. However, the higher the echo fraction, the longer the MR data acquisition time. It has been found in the preferred embodiment, that an echo fraction of approximately 80% provides acceptable high quality images.

The Fourier transformed data, $S'(x,k_y)$ is identical to transformed full echo, fractional NEX data, with additional blurring along the x direction that is associated with the zero-filling. According to the present invention, the next step is to perform fractional NEX homodyne processing along the $k_y$ direction.

The following is a review of an acceptable homodyne method. In general, the synthesis of the missing k-space data assumes that the MR data is Hermitian for a real-valued image. That is:

$$F(-k_x)=F^*(k_x) \qquad [3]$$

where the * denotes a complex conjugate. If the k-space is divided into 4 quadrants, the data for at least two of the four quadrants is needed in order to generate an image.

The following background is a review of the prior art homodyne method. If f(x) is the real-valued image and $\phi(x)$ is the spatially varying phase in the image, the expression for the complex valued image can be written as:

$$I(x)=f(x)exp(j\phi(x))=f_L(x)exp(j\phi_L(x))+f_H(x)exp(j\phi_H(x)),$$

$$\text{where } j=\sqrt{-1}. \qquad [4]$$

This expression is a linear combination of the Fourier transforms of the low-pass and high-pass filtered k-space data, respectively. In homodyne reconstruction, the phase is assumed to be slowly varying and that $\phi_L(x) \approx \phi_H(x)$. Therefore, if only one-half of the high-pass filtered data is available, this is equivalent to multiplying the high-pass filtered data by a Heaviside function such that the resulting image is given by:

$$I_H(x) = f_L(x)exp(j\phi_L(x)) + \qquad [5]$$
$$f_H(x)exp(j\phi_L(x)) \otimes \frac{1}{2}\left(\delta(x) + \frac{1}{j\pi x}\right),$$

where $\otimes$ denotes a convolution. Since the convolution term decays with 1/x and that the phase is slowly varying, Eqn. [5] can be rewritten as:

$$I_H(x) \approx \left(f_L(x) + \frac{1}{2}f_H(x) - \frac{j}{2}f_H(x) \otimes \frac{1}{\pi x}\right)exp(j\phi_L(x)). \qquad [6]$$

If the available high frequency data is weighted by 2, Eqn. [6] can be written as:

$$I_H(x) = \left(f_L(x) + f_H(x) - jf_H(x) \otimes \frac{1}{\pi x}\right) \exp(j\phi_L(x)). \quad [7]$$

If the spatially varying phase term is divided out, the image is then the real-valued part of $I_H(x)\exp(-j\phi_L(x))$, i.e.:

$$f_L(x)+f_H(x)=f(x)=Re(I_H(x)\exp(-j\phi_L(x))), \quad [8]$$

where the spatially varying phase is estimated from the phase of the Fourier transform of the low-pass filtered data. It is noted that in Eqn. [8], all phase information has now been lost. Note that Eqn. [8] could easily be written as $f(x)=Re(I_H(x))e^{-j\phi_L(x)}$ where the phase in the image is the low spatial frequency phase. However, this phase is only an estimate and is of little use. Hence, this technique is not suitable for phase contrast reconstruction. Furthermore, the loss of phase information requires that the Fourier transform in the x direction be performed first, before the homodyne reconstruction is applied to the data in the y direction.

Accordingly, as shown in FIG. 3, the data reconstructed in the $k_x$ direction by zero-filling is depicted as reconstructed zero-filled data section 52, and once there is complete data, 50, 52 along the $k_x$ direction, then the homodyne processing can be performed to acquire or synthesize the missing data in the $k_y$ direction to acquire a complete data set in the $k_y$ direction, including the homodyne reconstructed data section 54.

Figure 4:
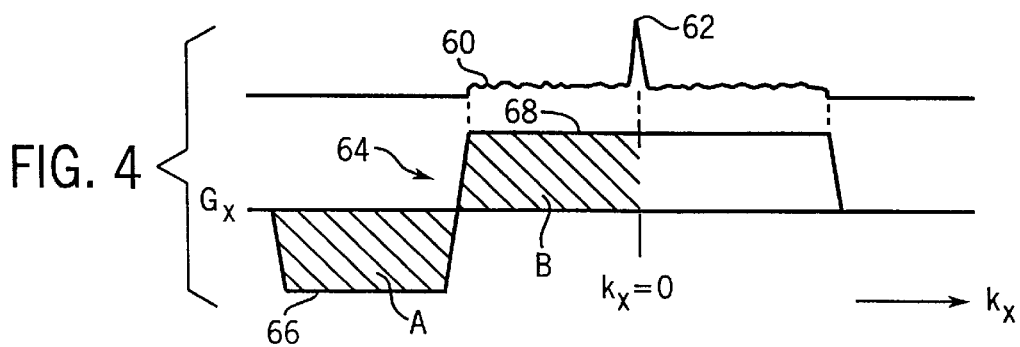
FIG. 4 is a graph of an echo signal and a dephasing and a rephasing gradient representation for a full MRI data acquisition.
Figure 5:
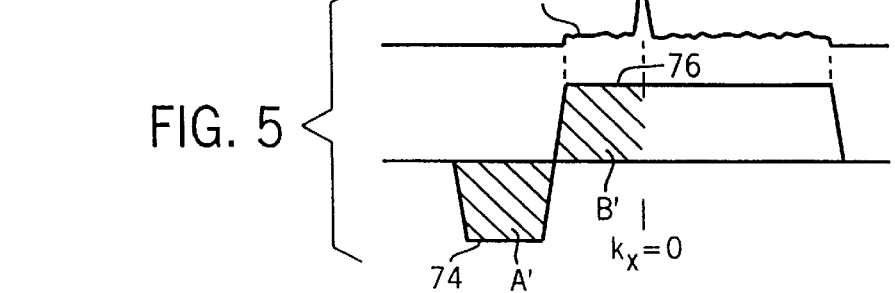
FIG. 5 is a graph of an echo signal and a dephasing and rephasing gradient representation for a partially acquired data set according to the present invention.

Referring to FIG. 4, a typical, data acquisition is shown is which an echo pulse 60, having an echo peak 62 is shown above a gradient signal 64. The gradient signal includes a dephasing gradient 66 and a rephasing gradient 68. As is known, in order to obtain the desired rephasing gradient, a dephasing gradient of approximately same gradient area as the desired rephasing gradient (measured from the start of the gradient to the echo peak) is required during which the spins are wound in the negative direction. As shown in FIG. 5, with the present invention, the necessary data acquisition is acquired with significant reduced acquisition time. The echo pulse 70 with echo peak 72, is produced with a reduced pulse width dephasing gradient area 74, and thus a reduced rephasing gradient area 76. This results in less acquisition time to acquire the reduced $k_x$ points. That is, the reduced number of $k_x$ points acquired in the $-k_x$ space, results in the minimization of echo time (TE). Since echo time (TE) is determined by the time between the peak of the RF pulse and the peak of the echo 62, 72, it is evident that reducing the $k_x$ points to the left of $k_x=0$ will reduce the TE time.

Comparing FIGS. 4 and 5, the area of gradient A, the negative gradient area 66 is equal to the area of gradient B, the positive gradient 68. By making a reduction in the $k_x$ points acquired, the area of gradient A', FIG. 5, is reduced and therefore the area of gradient B' is equally reduced since the area of the positive gradient is equal to the area of the negative gradient and the TE time savings is thereby amplified.

Referring to FIG. 6, the steps of the present invention are disclosed in flow chart form, which can also be used in programming the computer 10 of FIG. 1 to acquire a MR data acquisition system designed to reduce total echo and acquisition. The computer includes a means to partially acquire an MRI data set in both a $k_x$ direction and the $k_y$ direction 80. The partial MRI data set has data present in the $k_x$ direction and in the $k_y$ direction and has data missing in the $k_x$ direction and the $k_y$ direction. Preferably, an 80% partial echo is taken in the $k_x$ direction and a 60% partial NEX in the $k_y$ direction. The resulting data is in the k-space domain and is referred to as $S(k_x, k_y)$.

The MRI system also includes a means for interpolating the partial MRI data set into a complete $k_x$ MRI data set in the $k_x$ direction. Such a means for interpolating includes zero-filling data in the $k_x$ direction and taking a Fourier transform in $k_x$ to acquire an equivalent full $k_x$ data set in an x direction 82. The resulting data is now in the time domain in the x direction and in the frequency domain in the $k_y$ direction and can be expressed as $S(x, k_y)$.

The MRI system according to the present invention is then programmed to synthesize the partial MR data set in the $k_y$ direction via a means for synthesizing the $S(x, k_y)$ MRI data in the $k_y$ direction 84. In the preferred embodiment, the synthesizing is accomplished by homodyne processing the $S(x, k_y)$ data set as previously set forth.

The MRI system also includes a means for reconstructing an MR image using the interpolated and synthesized complete x,y MRI data set, as shown in FIG. 3, to produce an image 86, FIG. 6, in a reduced total time while any blurring effects are minimized by acquiring at least an 80% echo and a 60% NEX.

It is understood that a lower limit for the data acquisitions may be acceptable depending upon the object being imaged. Further, in the preferred embodiment the data is synthesized or reconstructed in the $k_x$ direction first to acquire a full $k_x$ data set, and then synthesized in the $k_y$ direction by homodyne reconstruction. This sequential operation is necessary because in homodyne reconstruction the phase of the data is lost and cannot be expected to be used to reconstruct data in the $k_x$ direction.

The foregoing description is based on a two-dimensional model for the present invention. However, it is contemplated that the present invention can be extended into multiple dimensions, such as three-dimensional and above. As previously described, in order to reconstruct data in two or more dimensions, the phase must be preserved after the reconstruction of the first dimension. In the preferred embodiment, it was noted that zero-filling prior to a Fourier transform will preserve phase information in a partial data acquisition in k-space reconstruction. Since the homodyne method of partial k-space reconstruction results in data with all phase information lost, subsequent data reconstructions are not possible. Therefore, any step using the homodyne method will be the terminal step.

In general terms then, for multi-dimensional partial k-space data of n-dimensions, the data reconstruction of the (n-1) dimensions is preferably by the zero-filling technique, with the subsequent, nth dimension reconstructed using the homodyne method. Therefore, the present invention includes a method of additionally acquiring a partial MRI $k_z$ data set in k-space along a $k_z$ direction. The partial MRI $k_z$ data set would preferably contain less than 100% of $k_z$ direction data but preferably more than 50% of the possible $k_z$ direction data. It is understood that the notation $k_z$ can refer to any dimension and the process is applicable to any number of dimensions.

The method further includes reconstructing an MR image using the partial $k_x$ data set, the partial $k_y$ data set, and the partial $k_z$ data set, and any other dimensional data set desirable. As will be well understood by those skilled in the art, the multi-dimensional extension of the present invention is readily programmable and adaptable to the aforementioned computer system.

The present invention has been described in terms of the preferred embodiment, and it is recognized that equivalents, alternatives, and modifications, aside from those expressly stated, are possible and within the scope of the appending claims.

What is claimed is:

1. A method of MR imaging using fractional MRI acquisitions to reduce total acquisition time comprising the steps of:
   initiating an MRI scan to acquire MRI data;
   acquiring a partial MRI $k_x$ data set in k-space along a $k_x$ direction, the partial MRI $k_x$ data set containing less than 100% of $k_x$ direction data but more than 50% of $k_x$ direction data;
   acquiring a partial MRI $k_y$ data set in k-space along a $k_y$ direction, the partial MRI $k_y$ data set containing less than 100% of $k_y$ direction data but more than 50% of $k_y$ direction data; and
   reconstructing an MR image using the partial MRI $k_x$ data set and the partial MRI $k_y$ data set.

2. The method of claim 1 wherein the step of reconstructing an MR image further comprises the steps of zero-filling missing data in the $k_x$ direction by using the acquired partial MRI $k_x$ data set.

3. The method of claim 2 wherein the step of zero-filling missing data is further defined as taking a Fourier transform of the acquired partial MRI $k_x$ data set to generate an image in an x direction which is a synthesized equivalent of a full x data set.

4. The method of claim 2 wherein the step of reconstructing an MR image further comprises the step of synthesizing missing data in the $k_y$ direction by using the acquired partial MRI $k_x$ data set, the acquired MRI $k_y$ data set, and the zero-filled missing data in the $k_x$ direction to acquire a full MRI $k_y$ data set.

5. The method of claim 4 wherein the steps of synthesizing missing data in the $k_y$ direction is further defined as applying a partial k-space reconstruction algorithm to the partial MRI $k_y$ data set to acquire a full MRI data set.

6. The method of claim 1 further comprising the step of shifting echo formation in a negative direction to reduce data points in the $k_x$ direction.

7. The method of claim 1 wherein approximately 80% of possible data in the $k_x$ direction is acquired and approximately 60% of possible data in the $k_y$ direction is acquired, and the step of reconstructing an MR image further comprises synthesizing missing $k_y$ data only after first zero-filling missing $k_x$ data.

8. An MR data acquisition system designed to reduce total time in image acquisition comprising:
   a magnetic resonance imaging system having a plurality of gradient coils positioned about a bore of a magnet to impress a polarizing magnetic field and a RF transceiver system and an RF modulator controlled by a pulse control module to transmit RF signals to an RF coil assembly to acquire MR images; and
   a computer programmed to:
      acquire a partial MR data set having data in a $k_x$ direction and data in a $k_y$ direction and having data missing in the $k_x$ direction and data missing in the $k_y$ direction;
      Fourier transform the partial MR data set in the $k_x$ direction to acquire an equivalent full x data set in an x direction;
      synthesize the partial MR data set in the $k_y$ direction using the equivalent full x data set to acquire an equivalent full x,y data set;
      reconstruct an MR image using the equivalent full x,y data set.

9. The system of claim 8 wherein the computer is further programmed to assign zero-values to the partial MR data set in the $k_x$ direction where data is missing, wherein a resulting data set is equivalent to a complete $k_x$ data set multiplied by a step function defined by $u(k_x+k_{y0})$.

10. The system of claim 9 wherein the computer is further programmed to homodyne process the equivalent full x data set along the $k_y$ direction to acquire the equivalent full x,y data set.

11. The system of claim 8 wherein the data missing in the $k_x$ direction is approximately 20% of a complete $k_x$ data set and the data missing in the $k_y$ direction is approximately 40% of a complete $k_y$ data set.

12. An MRI system for minimizing data acquisition time comprising:
   means for partially acquiring an MRI data set in both a $k_x$ direction and a $k_y$ direction;
   means for interpolating the partial MRI data set into a complete $S(x,k_y)$ MRI data set in an x direction;
   means for synthesizing the complete $S(x,k_y)$ data set in the $k_y$ direction into a complete x,y MRI data set;
   means for reconstructing an MR image using the complete x,y MRI data set acquired with reduced acquisition time.

13. The system of claim 12 wherein the means for interpolating further comprises means for zero-filling data by Fourier transforming the acquired partial MRI data set in the $k_x$ direction.

14. The system of claim 12 wherein the means for synthesizing further comprises means for homodyne processing the complete $S(x,k_y)$ MRI data set.

15. The system of claim 12 wherein the means for partially acquiring an MRI data set includes acquiring an 80% echo and a 60% NEX to reduce both echo time and total acquisition time while minimizing any blurring effects due to a reduced echo.

16. The method of claim 1 further comprising the steps of acquiring a partial MRI $k_z$ data set in k-space along a $k_z$ direction, the partial MRI $k_z$ data set containing less than 100% of $k_z$ direction data but more than 50% of $k_z$ direction data; and
   reconstructing an MR image using the partial MRI $k_x$ data set, the partial MRI $k_y$ data set, and the partial MRI $k_z$ data set.

17. The method of claim 16 wherein the step of reconstructing an MR image further comprises the steps of zero-filling missing data in at least two directions by using the acquired partial data sets to derive estimates of missing data in the at least two directions.

18. The method of claim 17 wherein the step of reconstructing an MR image further comprises the step of synthesizing missing data in a last direction by using zero-filled missing data and the acquired partial data sets to acquire a full MRI data set.

19. The system of claim 8 wherein the computer is further programmed to:
   acquire a partial MR data set having data in a $k_z$ direction and data missing in the $k_z$ direction; and
   Fourier transform the partial MR data set in the $k_z$ direction to acquire an equivalent full z data set in a z direction before synthesizing the partial MR data set in the $k_y$ direction; and
   reconstruct an MR image using the equivalent full x, y, z data set.

20. The system of claim 19 wherein the computer if further programmed to assign zero values to the partial MR data set in the $k_x$ direction and the $k_z$ direction where data is missing.

21. The system of claim 20 wherein the computer is further programmed to homodyne process the equivalent full x data set and the equivalent full z data set along the $k_y$ direction to acquire the equivalent full x, y, z data set.

22. The system of claim 12 wherein the means for partially acquiring an MRI data set is further defined to partially acquire an MRI data set in a $k_z$ direction, and the means for interpolating is further defined to interpolate the partial MRI data set into a complete $S(x,k_y,z)$ MRI data set in an x and z direction and the means for synthesizing, further synthesizes the complete $S(x,k_y,z)$ data set in the $k_y$ direction into a complete x,y,z MRI data set and the means for reconstructing, further reconstructs an MR image using the comple te x,y,z MRI data set.

* * * * *